United States Patent [19]
Palmer

[11] 3,963,920
[45] June 15, 1976

[54] INTEGRATED OPTICAL-TO-ELECTRICAL SIGNAL TRANSDUCING SYSTEM AND APPARATUS

[75] Inventor: John P. Palmer, Pomona, Calif.

[73] Assignee: General Dynamics Corporation, Pomona, Calif.

[22] Filed: Mar. 10, 1975

[21] Appl. No.: 556,612

[52] U.S. Cl. .......................... 250/239; 250/211 R; 250/227; 250/238; 250/347; 250/203 R
[51] Int. Cl.² ...................... H01J 39/12; G02B 5/16
[58] Field of Search ........ 250/338, 347, 203, 211 R, 250/211 J, 227, 238, 239; 350/96 B; 357/30

[56] References Cited
UNITED STATES PATENTS

| | | | |
|---|---|---|---|
| 3,423,594 | 1/1969 | Galopin | 250/211 J |
| 3,585,454 | 6/1971 | Roberts | 250/227 X |
| 3,757,127 | 9/1973 | Dhaka | 250/239 X |
| 3,814,933 | 6/1974 | Weber | 250/227 |
| 3,872,308 | 3/1975 | Hopson et al. | 250/347 |
| 3,896,305 | 7/1975 | Ostrowsky et al. | 250/227 |

OTHER PUBLICATIONS
Thermoelectric Cooler, Pesco Products, Spec. Sheet for Model 094567–010 1962.

*Primary Examiner*—Eugene La Roche
*Attorney, Agent, or Firm*—Henry M. Bissell; Edward B. Johnson

[57] ABSTRACT

An integrated optical-to-electrical signal transducing system and apparatus therefor which, through the use of a novel combination of fiber optics and microelectronics, permits locating the optical signal detection circuits close to their associated preamplifier circuits and remote from sources of interfering signals without losing the ability to do effective optical tracking or seeking. Specific structure including a hybrid microelectronic device package modified to receive optical input signals through a fiber optics terminal incorporated therein is provided to achieve the desired results.

18 Claims, 5 Drawing Figures

INTEGRATED OPTICAL-TO-ELECTRICAL SIGNAL TRANSDUCING SYSTEM AND APPARATUS

BACKGROUND OF THE INVENTION

1. Field of the Invention

This invention relates to integrated optical-to-electrical signal transducing systems and apparatus and, more particularly, to such systems combining fiber optic techniques and hybrid micro-electronic device packaging techniques.

2. Description of the Prior Art

Traditional optical tracking or seeking systems use one or more detectors located at the focal point of the tracker's optics. This location of the detector or detectors is undesirable for several reasons. First, there is usually a servo or gyro drive system associated with the tracker or seeker. Such drive systems radiate fields which may interfere with the data signals from the detectors. Further, it is difficult to locate the detector amplifiers in close proximity to each detector while in the focal point region. This results in long lead lengths from the detector to the preamplifiers, creating excessive noise pick-up and cross-talk between channels. This condition also limits the frequency response and effectively reduces the reliability of the system. Accordingly, it is a general object of this invention to overcome the disadvantages associated with the optical detector/preamplifier systems of the prior art.

It is a further object of this invention to maximize the signal-to-noise ratio in apparatus involving optical signal detection and amplification of the electrical signal derived from such detection.

It is a specific object of this invention to provide apparatus which will permit remote location of the optical-to-electrical signal conversion apparatus from the optical focus in an optical tracking system.

It is yet another object to provide system integration for optical-to-electrical signal conversion apparatus by coupling the optical signals, via optical transmission lines, into an hermetically sealed microelectronic preamplifier circuit package.

It is a still further object of this invention to provide optical-to-electrical signal conversion apparatus with maximum signal-to-noise ratio and with maximum bandwidth.

SUMMARY OF THE INVENTION

In brief, the present invention utilizes fiber optics to carry optical signals from the point or plane where the maximum optical signals are generated to a remote point where optical-to-electrical signal conversion can be effected with maximum flexibility and efficiency. At that remote point the optical fibers are terminated in a terminator plug secured in one outer wall of a standard hybrid microelectronics device (HMD) package which has been modified to receive a terminator plug. The optical signal detectors, which may be of the photo-conductive or photo-voltaic variety, are supported within the HMD package directly opposite their respective optical fiber input and immediately proximate to their associated preamplifiers. Lead lengths are thus minimized, reducing stray capacitance and inductance, and thereby improving the elimination of cross-talk and stray noise pick-up. An improvement in the transducer system bandwidth is also realized. To further improve the signal-to-noise ratio in the detection apparatus, particularly during detection of signals at infrared frequencies, thermo-electric cooling techniques can be incorporated within the HMD package.

BRIEF DESCRIPTION OF THE DRAWINGS

A better understanding of the invention may be had from a consideration of the following detailed description, taken in conjunction with the accompanying drawings, in which.

DESCRIPTION OF THE PREFERRED EMBODIMENTS

Figure 1:
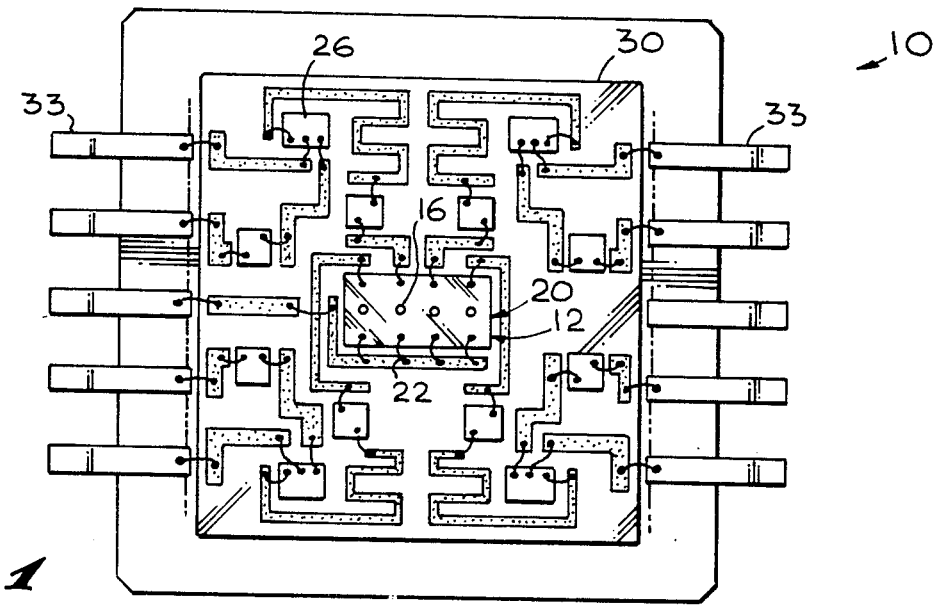
FIG. 1 is a plan view of a particular embodiment of the invention with the cover removed, showing the integrated fiber optics, detector, and preamplifier stages.
Figure 2:
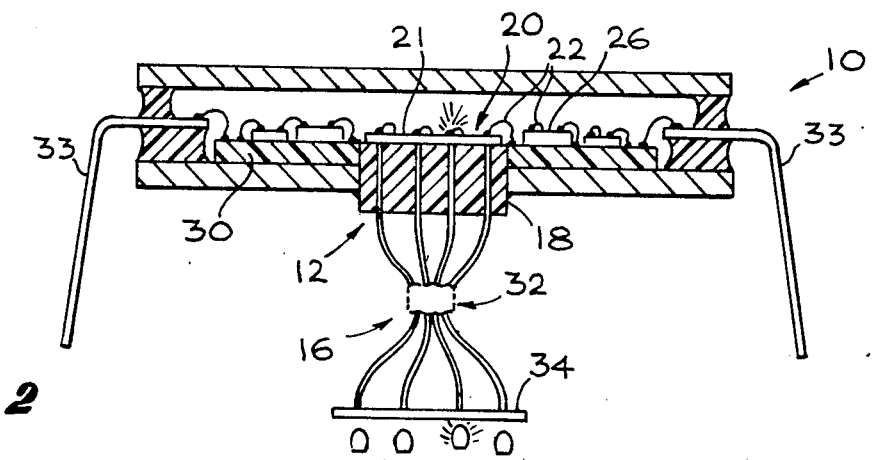
FIG. 2 is a side sectional view of the embodiment of FIG. 1 with the cover in place.

The hybrid circuit structure of FIGS. 1 and 2 includes a preamplifier assembly defined by semiconductor regions 26; a photo detector array 20; and an optical fiber termination assembly 12, supported by the substrate 21 of photo detector array 20. These components are integrated into a class of hybrid microelectronic device (HMD) packages, commonly referred to as "Flatpacks". The "Flatpack" 10 consists of a small, hermetically sealed ceramic or metallic enclosure having glass/metal feedthrough conductors forming connector leads 33. The enclosure supports a ceramic substrate 30 upon which the circuit components are deposited or bonded. In the present embodiment, the enclosure of Flatpack 10 as shown in FIG. 2 has been modified to have an opening at its base configured in such a fashion as to permit a terminator plug of fiber optics termination assembly 12 to fit snugly therein while maintaining the proper hermetic seal of the package.

The fiber optics termination assembly 12 includes a cast resin substrate 18 through which a bundle of optical fibers 16 is implanted. The substrate 18 could also be made of a ceramic material, for example. The upper surface of the substrate 18 is ground and polished so that the ends of the fibers are smooth and flush with the plane normal to the fibers' longitudinal axes. This assures minimum dispersal of the light carried by the fibers 16. A detector array 20 is shown in the form of a transparent substrate 21, e.g. glass or sapphire, supporting a thin detector film (not shown). The optical fiber substrate is cast onto the back (lower) side of the detector substrate 21. The optically sensitive regions of the film extend over the polished end surfaces of the optical fibers 16 in such a manner that they are in registration with respect to each other. Output signals from the thin film detector array 20 are coupled by means of wire bond leads 22 to the semiconductor regions 26 which define the preamplifier assembly. Output signals from the preamplifier assembly are taken from connector leads 33.

The apparatus which has just been described is particularly useful in connection with those target seeking and tracking systems that sense radiation energy ranging from the infrared to the ultraviolet regions of the electromagnetic spectrum. The energy is collected at the tracker by means of a parabolic reflector or the like and focused into a point or plane where it is received by one end of the bundle of optical fibers 16 and transmitted to the detector array 20 at the other end. The electrical response characteristic of each detector of the array 20 is sensitive to the light emitted from its associated fiber, thereby giving the desired detection capability. As illustrated in FIG. 2, fiber No. 3 is transmitting light energy, whereas the other fibers are dark. Detector No. 3 consequently provides a response to the transmitted light, thus indicating the illumination of fiber No. 3 at the output circuitry.

The optical fiber bundle 16, composed of fibers which are extremely fragile, is installed in a mechanical sub-assembly or harness represented by 32, one end of which terminates on the focal plane surface 34 and the other, as explained above, on substrate 18. The ends of the optical fibers 16 at the focal plane terminator 34 are ground optically smooth and normal to the longitudinal axes of the fibers to maximize sensitivity and directional accuracy to the detector array 20.

Figure 3:
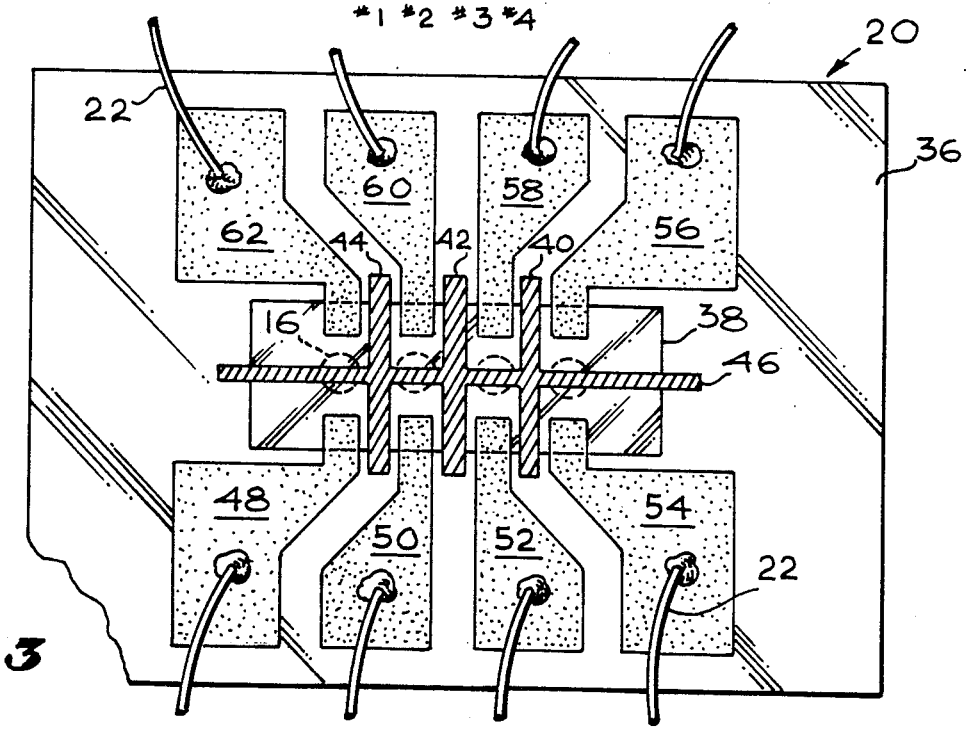
FIG. 3 is an enlarged plan view of the detector array portion of FIG. 1.

A particular thin film detector array 20 of the photo-conductive type is shown in FIG. 3 as including a substrate 36 of ceramic or glass upon which a thin semiconductor layer, such as cadmium sulfide or lead selenide, is vacuum deposited over a rectangular area 38. This material, at the time it is deposited, is moderately conductive and light insensitive. However, certain regions of the area 38—that is, those regions 40, 42, 44 and 46 shown darkly shaded—are sensitized by diffusing into those regions a small quantity of selected impurities such as copper or silver. Those impurities greatly reduce the concentration of electrical charge carriers in the diffused region and, as a result, the electrical resistivity is greatly increased. Following such diffusion, therefore, regions 40, 42, 44 and 46 are highly light-sensitive in addition to being highly resistive to the flow of electricity. The optical fibers 16 terminate under the narrow diffusion strip 46 and electrical connections are made by means of a plurality of wire bond leads 22 bonded to a plurality of conductive pads 48, 50, 52, 54, 56, 58, 60 and 62 vacuum deposited onto the relatively high-conductivity portions of the rectangular film 38 where diffusion of impurities has not occurred.

As briefly mentioned above, the resistance between conductive elements on the opposite sides of a common optical fiber varies depending upon the amount of radiant energy that is impinging on the portion of the strip 46 between the opposing ends of such conductive elements. For example, the resistance between the element 48 and the element 62 will be decreased if, in FIG. 3, the extreme left optical fiber 16 is illuminated and, correspondingly, illuminates the strip 46 in the region between the element 48 and the element 62. This photo-conductive change permits optical detection of signals at infrared, ultraviolet or visible frequencies when such signals impinge on the focal plane surface 34 (FIG. 2).

Figure 4:
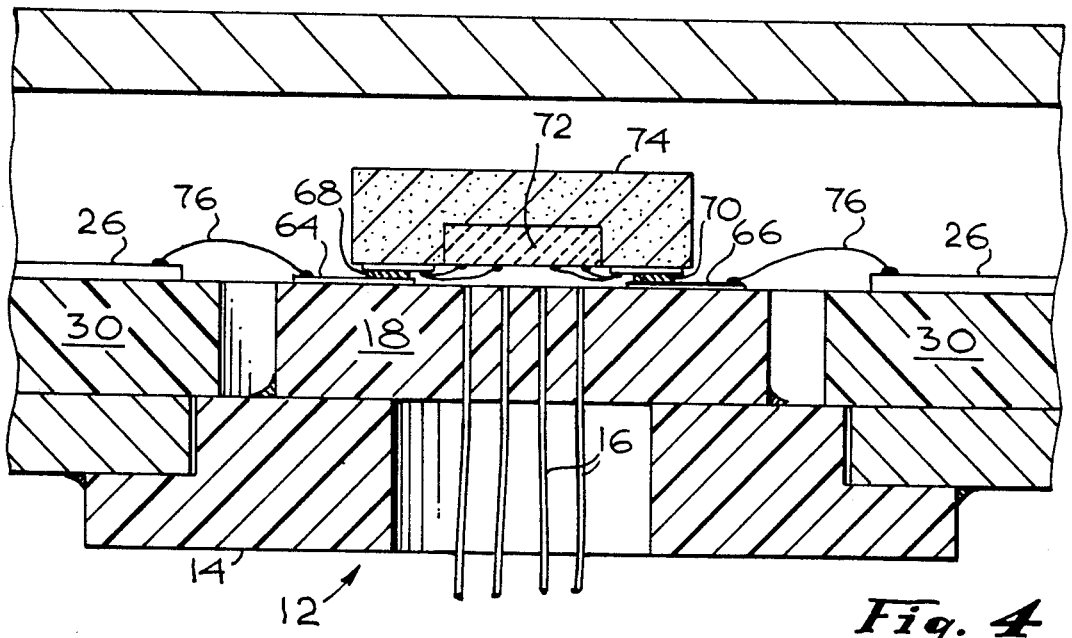
FIG. 4 is a sectional view of an alternative configuration for a portion of the structure of FIG. 1.

The embodiment in FIG. 4 employs a photo-voltaic rather than a photo-conductive technique for optical signal detection. The fiber optics terminator plug 14 again carries the substrate 18 in which the optical fibers 16 terminate. A pair of electrical terminations 64 and 66 with a pair of respective raised metal bond pads 68 and 70 are deposited on the terminal substrate 18. A single-crystal photo-voltaic converter 72 which has a series of photo-voltaic converter junctions (not shown) is mounted in a ceramic substrate 74, such substrate being placed face down on the pads 68 and 70, as shown, and die bonded or beam-lead bonded to them. The positioning of the single crystal 72 is such that its light-sensitive junctions are in registration with the optical fibers 16 so as to produce electrical output when the fibers receive energy at the focal plane terminator 34 (FIG. 2). Output signals from the single crystal 72 are carried by a plurality of wire bond leads 76 to the microelectronic amplifying chips 26 carried by the substrate 30, as in FIG. 1.

Although the foregoing description for FIG. 4 pertains to bulk crystal photo-voltaic detection, it will be appreciated by those skilled in the art that thin film photo-voltaic detectors can be used in lieu thereof.

Figure 5:
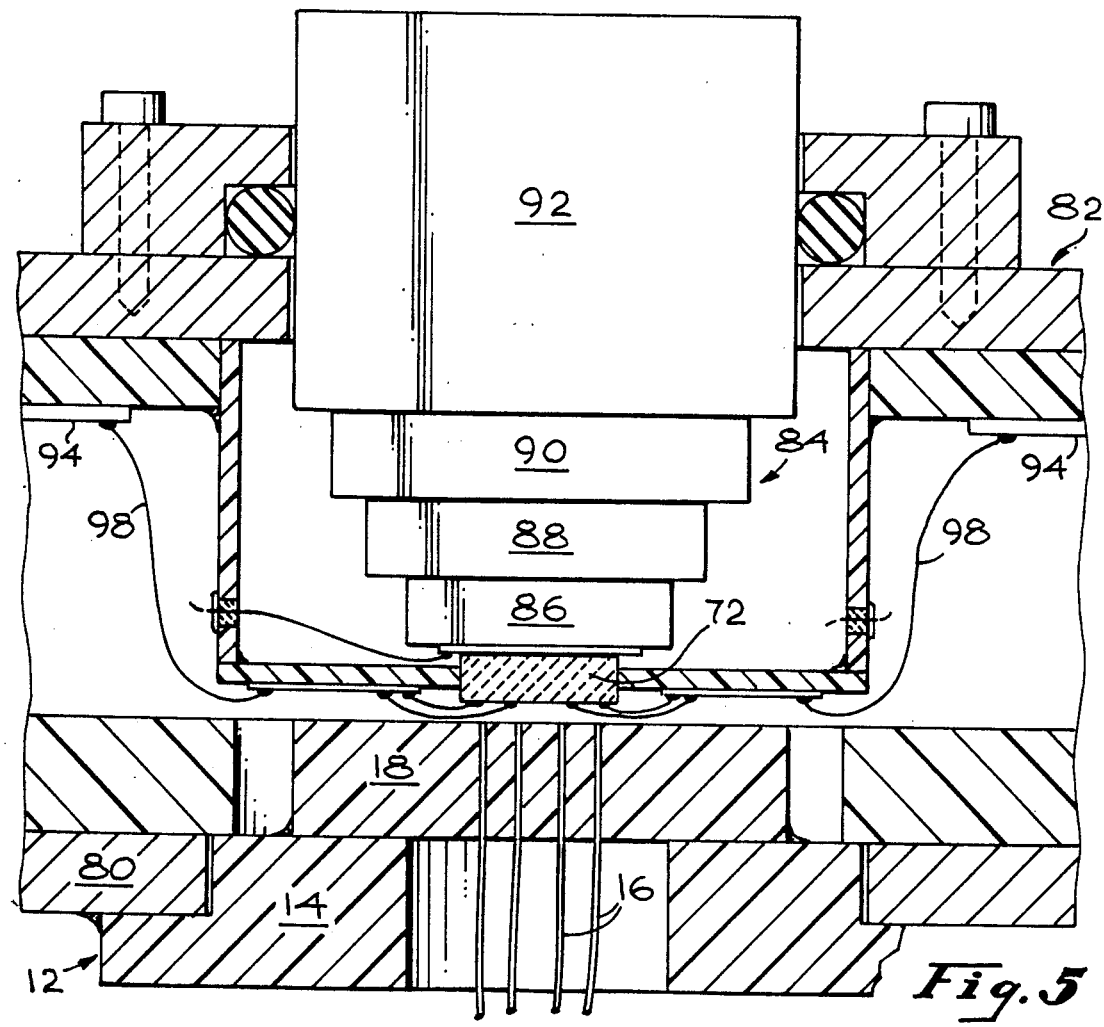
FIG. 5 is a sectional view of an advanced form of the configuration of FIG. 4.

It is well known that cooling a photo-voltaic converter incorporating a p-n junction will increase the signal-to-noise ratio and effectively increase the photo-electric conversion efficiency, particularly for infrared signals. FIG. 5 shows how such cooling may be achieved within the confines of a compact HMD package.

In FIG. 5, fiber optic terminating plug 14 is inserted in one wall 80 of the hybrid microelectronic device package 10, whereas the detector array 72 is carried on the opposite wall 82 of the package. This configuration permits the inclusion of a thermo-electric cooler 84, comprising three stages of thermo-electric junctions 86, 88, 90 mounted on a heat sink 92 which is bonded to the wall 82 of the package 10. The detector array 72 is bonded to its most proximate thermo-electric cooling junction 86. Such a thermo-electric method for cooling the detector array 72 permits very efficient detection of infrared energy carried into the array by the optical fibers 16. Electrical signals from the optical detector 72 are carried to a plurality of microelectronic circuits 94 by means of a plurality of leads 98 for further processing.

Although there have been described hereinbefore specific embodiments of an integrated optical-to-electrical signal transducing system and apparatus therefor in accordance with this invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of this invention.

What is claimed is:

1. Integrated optical-to-electrical signal transducing apparatus comprising, in combination:
    a container including a first wall;
    an optical fiber terminating plug supporting a plurality of spaced first ends of optical fibers and carried in said first wall, said plug having a terminating surface ground optically smooth and polished in a plane normal to the longitudinal axis of the fibers and including the first ends of the fibers in said surface;
    an array of photo-sensitive elements supported in said container with said elements opposing respective ones of said spaced ends of said optical fibers, said array comprising a single detector substrate having a first planar surface aligned with and in contact with said plug terminating surface and a thin semiconductor layer vacuum deposited over an area of the detector substrate encompassing the ends of the fibers, selected regions of said layer in respective registration with corresponding ones of said fiber ends being sensitized to form said photo-sensitive elements as light-sensitive barriers to current flow through said regions;

preamplifier means carried in said container and coupled to respective ones of said photo-sensitive elements for responding to current through a selected barrier region in response to light at a corresponding fiber end; and means for taking output signals from said preamplifier means.

2. Apparatus according to claim 1 including means for supporting the photo-sensitive elements from said optical fiber terminating plug.

3. Apparatus according to claim 1 in which said optical fiber terminating plug includes a cast resin member having at least one planar face in which said optical fibers terminate.

4. Apparatus according to claim 1 in which said container is an hermetically sealed, microelectronics package.

5. Apparatus according to claim 1 which includes, in addition, a focal plane terminating plate supporting a plurality of spaced remaining ends of said optical fibers, said terminating plate being remote from said container.

6. Apparatus in accordance with claim 1 wherein said detector substrate comprises an optically transparent material and said photo-sensitive elements are positioned on a surface of the detector substrate remote from the first planar surface.

7. Apparatus according to claim 1 in which said photo-sensitive elements are photo-conductive in character.

8. Apparatus according to claim 7 in which said semiconductor layer consists of cadmium sulfide.

9. Apparatus according to claim 1 in which said preamplifier means include microelectronic devices.

10. Apparatus according to claim 9 including means supporting the microelectronic devices from said first wall.

11. Apparatus according to claim 1 in which said photo-sensitive elements are photo-voltaic in character.

12. Apparatus according to claim 11 in which said photo-voltaic elements comprise p-n junctions in a single crystal.

13. Apparatus according to claim 1 in which said container includes, in addition, a second wall remote from said first wall; and a thermo-electric cooler supported by said second wall, said thermo-electric cooler supporting said array of photo-sensitive elements.

14. Apparatus according to claim 13 in which said photo-sensitive elements are photo-voltaic in character.

15. Apparatus in accordance with claim 1 wherein the photo-sensitive elements further comprise a plurality of conductive pads vacuum deposited onto respective remaining non-sensitized portions of the semiconductor layer.

16. Apparatus in accordance with claim 15 further including a plurality of electrical connecting means extending between individual ones of said pads and corresponding ones of said preamplifier means.

17. Apparatus in accordance with claim 15 wherein the sensitized regions of said semiconductor layer extend in a configuration to provide electrical isolation between each of said pads and every other one of said pads.

18. Apparatus in accordance with claim 17 wherein said sensitized regions are configured to establish a conductive path between a pair of conductive pads opposite an illuminated fiber while maintaining electrical isolation between all other pairs of conductive pads opposite fibers which are not illuminated.

* * * * *